United States Patent [19]
Yamaguchi et al.

[11] Patent Number: 5,373,436
[45] Date of Patent: Dec. 13, 1994

[54] POWER CONVERTING DEVICE WITH INVERTER CIRCUITRY FOR DRIVING MULTIPLE-PHASE VARIABLE-SPEED MOTOR

[75] Inventors: Yoshihiro Yamaguchi, Urawa; Yoshiyuki Sano, Yokohama, both of Japan

[73] Assignee: Kabushiki Kaisha Toshiba, Kawasaki, Japan

[21] Appl. No.: 906,490

[22] Filed: Jun. 30, 1992

[30] Foreign Application Priority Data

Jul. 1, 1991 [JP] Japan ................................. 3-160571

[51] Int. Cl.$^5$ ............................................. H02M 7/5387
[52] U.S. Cl. ................................. 363/98; 363/132; 318/811
[58] Field of Search ........................ 363/41, 98, 132; 388/811, 819, 907.2; 318/811

[56] References Cited

U.S. PATENT DOCUMENTS 5,216,587  6/1993  Miyazaki et al. ............... 363/98 X
5,253,156 10/1993  Sakurai et al. .................. 363/98

OTHER PUBLICATIONS

EDN Electrical Design News, vol. 32, No. 18, Sep. 3, 1987, pp. 227–234, Daniel Artusi, et al., "Solid–State Devices Ease Task of Designing Brushless DC Motors".

IEEE Transactions on Power Electronics, vol. 6, No. 1, Jan. 1991, pp. 118–126, Thomas M. Jahns, et al., "Integrated Current Regulation for a Brushless ECM Drive".

Electronique Radio Plans, No. 523, Jun. 1991, pp. 89–93, R. Lahaye, "La Serie SP–600, Circuits HT De Commande en Demi–Pont".

Nikkei Electronics (No. 456); Dean F. Henderson, et al. Sep. 19, 1988. pp. 213–224.

T. IEE Japan, vol. 111–D, No. 2, 1991, pp. 117–124; H. Miyazaki, et al. "250 V 1 A Three–Phase Monolithic Inverter IC for Brushless Motor Drives".

Primary Examiner—Emanuel T. Voeltz
Attorney, Agent, or Firm—Oblon, Spivak, McClelland, Maier & Neustadt

[57] ABSTRACT

A power conversion device of the inverter type for three-phase DC motor includes three parallel pairs of output transistors between a power supply voltage and the ground potential. These pairs provide three upper-stage transistors and three lower-stage transistors with diodes being coupled thereto. Drivers are connected to the transistors respectively. A capacitor for each upper-stage driver has an electrode coupled to the power supply voltage and the other electrode coupled to the ground through a corresponding lower-stage transistor. A controller controls the upper- and lower-stage drivers in response to a pulse width modulation (PWM) signal generated by a PWM generator to represent a desired motor rotation speed. The upper-stage transistors are PWM-driven so that each one turns on and off repeatedly during a 120-degree electrical angle period. While one upper-stage transistor is PWM-driven during a 120-degree period, a corresponding lower-stage transistor turns on in response to a reverse-phased pulse at the beginning of this period, thereby charging the capacitor.

14 Claims, 3 Drawing Sheets

POWER CONVERTING DEVICE WITH INVERTER CIRCUITRY FOR DRIVING MULTIPLE-PHASE VARIABLE-SPEED MOTOR

BACKGROUND OF THE INVENTION

1. Field of the Invention

The present invention relates generally to electric power converting devices and more particularly to an electric power converter for driving and controlling a load such as a variable-speed motor using a pulse width modulation (PWM) driving technique.

2. Description of the Related Art

In the recent past, power converting devices for variable-speed motor drive are becoming more widely used in the manufacture of a variety of electric equipment. A power converter typically includes an inverter circuit, which is packed in a one-chip integrated circuit (IC) device to meet the demand for reduction in size. The inverter includes in its output stage a plurality of pairs of power transistors for driving a variable-speed multiple-phase motor, typically a brushless direct current (DC) motor, in accordance with a pulse width modulation (PWM) drive technique.

For example, in the case of a three-phase brushless DC motor, three pairs of output transistors are arranged for electrically driving a plurality of winding coils to rotate a cone-shaped rotor of the DC motor. Usually, diodes are connected to the output transistors respectively. The three pairs of output transistors are connected in parallel with one another between a power supply voltage line and a ground potential line. Recently, insulated gate bipolar transistors (IGBTs) have been employed as the output transistors. One transistor of each pair, i.e., an IGBT coupled to the power supply line is called the "upper-stage transistor"; the other thereof is called the "lower-stage transistor" among those skilled in the art to which the invention pertains. In some cases, these upper- and lower-stage transistors may be called the "top-side transistor" and "bottom-side transistor" respectively.

The three parallel IGBT pairs are provided with driver circuits connected to the gate electrodes thereof respectively. These driver circuits are electrically fed by a common DC power supply unit. In particular, each of the three drivers for the upper-stage transistors is provided with a diode and a capacitor coupled thereto. The diode and the capacitor function to supply a corresponding driver with electric power. While the motor rotor is driven to rotate, when the lower-stage transistor of one output transistor pair turns on, current flows through the diode and the capacitor of a corresponding driver, thereby to charge the capacitor. The driver is thus activated by the charged capacitor. Activation of the driver causes the upper-stage transistor of the output transistor pair coupled thereto to turn on.

A controller is provided to be responsive to the output signals of three rotor-position detectors, which are arranged in the three-phase DC motor. The controller has control outputs connected through level shift circuits to the driver circuits for the upper-stage output transistors. The controller has other control outputs directly connected to the remaining three driver circuits for the lower-stage output transistors. The controller is provided with a circuit for providing a speed specify signal that is modulated in pulse width or pulse-width-modulated so as to represent a desired rotor speed of the DC motor.

In response to the rotor-position detection signals, the controller generates a plurality of control signals for pulse width modulation (PWM) drive of the three lower-stage output transistors. Conventionally, these PWM control signals are supplied to the driver circuits for the lower-stage transistors during mutually different time periods that are shifted by the electrical angle of 120 degrees and are equal in length to one another (120 degrees for each). Accordingly, each lower-stage output transistor repeats the turn-on and off switching operations in synchronism with the pulse width of the rotor-speed specify PWM signal during one 120-degree electrical angle period allocated thereto.

In each transistor pair, while its lower-stage transistor is PWM driven to repeat the turn-on/off switching operations, a corresponding upper-stage transistor coupled thereto is forced to turn off. When the upper-stage transistor in a certain pair turns on constantly during a specified 120-degree electrical angle period, the lower-stage transistor thereof is driven to turn off. At this time, one of those lower-stage transistors of the remaining two pairs is PWM driven to repeat the switching operations during the first half of the above 120-degree electrical angle period; the other lower-stage transistor of the remaining two pairs is PWM driven similarly during the second half of the 120-degree electrical angle period. By varying the pulse width modulation factor at these lower-stage transistors, the current supply to the motor may be done at a desired average value of current flow, thus controlling the motor so that its rotor rotates at a desired rate.

The significant problem of the conventional inverter is that a capacitor of large-capacity, which exhibits high charge storage capability, should be required as each of the capacitors coupled to the driver circuits for the lower-stage output transistors. The large capacitor is a serious bar to the miniaturization and cost-reduction of the inverter IC.

Such problem arises due to the following reasons. Looking at one of the three output transistor pairs for the purposes of explanation only, one power-feed capacitor for a certain driver circuit coupled to the one transistor pair is allowed to charge only during very shortened turn-on periods of the lower-stage transistor, which turns on and off repeatedly in synchronism with the PWM signal. When the lower-stage transistor turns on, the voltage at its drain electrode is substantially at the ground potential. Current rushes to flow from the DC power supply unit by way of the diode and capacitor associated with the driver circuit. This capacitor is then charged. The capacitor voltage rises in potential. The capacitor voltage is used to supply power to the driver circuit. The capacitor voltage is not given to this driver circuit for a certain electrical angle period (60-degree period, for example) before the upper-stage transistor will turn on again. The period will be as long as several hundreds of microseconds, if the rotation speed of DC motor is kept lower. To maintain the charged capacitor voltage for such a long period, the capacitor is required to have the enhanced charge storage capability, which is large enough to minimize the inherent natural discharge. Obviously, such capacitor is a massive element being larger in its physical volume.

SUMMARY OF THE INVENTION

It is therefore an object of the present invention to provide a new and improved electric power converting device.

It is another object of the present invention to provide a new and improved electric power converting device which can allow the use of a miniaturized capacitor for its internal power supply circuit.

In accordance with the above objects, the present invention is drawn to a specific power converting device which supplies an external load with a continuously variable current. The device includes an output stage section of bridge circuitry adapted to be coupled to the load. The output stage section has a series circuit of a first switch device and a second device. A first driver is connected to the first switch device, for electrically driving the same. The first driver is provided with a charge storage device, which is charged when the second switch device turns on. A second driver is connected to the second switch device, for electrically driving the second switch device. A control unit is connected to the first and second drivers, for (i) causing, during a designated period, the first driver to supply the first switch device with a pulse signal which is modulated in pulse width at a desired index of pulse width modulation to drive the first switch device in a pulse width modulation control manner, thereby to provide the load with a suitable current corresponding to the desired index of pulse width modulation. The control unit also provides the second switch device with at least one pulse, which is reverse in pulse phase to the pulse signal, to force the second switch device to turn on even during the period, thereby charging the charge storage device.

The foregoing and other objects, features, and advantages of the invention will become apparent from the following more particular description of preferred embodiments of the invention, as illustrated in the accompanying drawings.

DETAILED DESCRIPTION OF THE PREFERRED EMBODIMENTS

Figure 1:
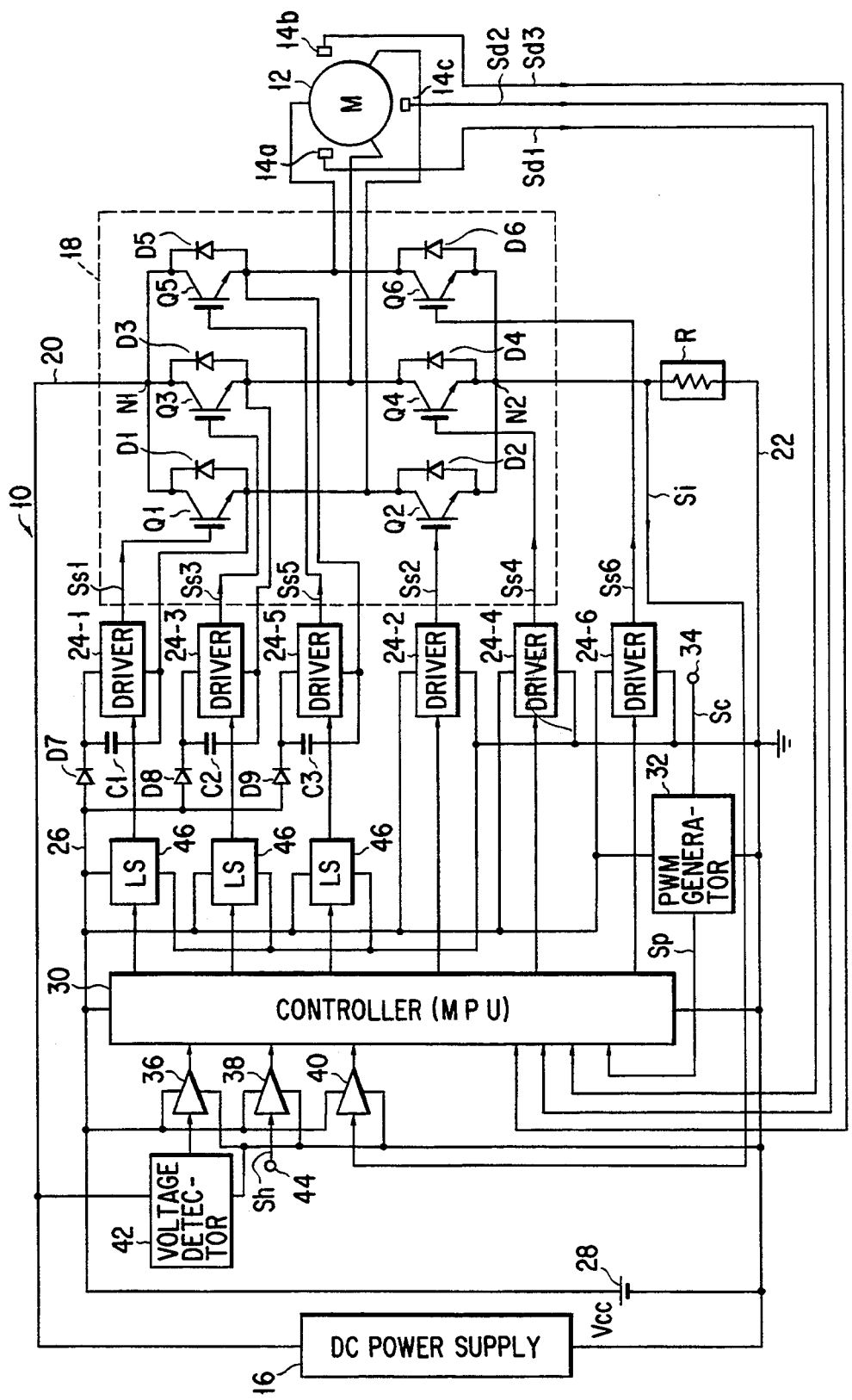
FIG. 1 is a diagram schematically showing the overall arrangement of a three-phase inverter circuit for speed-variable DC motor in accordance with one preferred embodiment of the present invention.

Referring now to FIG. 1, an electric power converting device in accordance with one preferred embodiment of the invention is generally designated by the numeral 10. The power converter 10 typically has a pulse width modulation (PWM) inverter circuit configuration for driving a variable-speed three-phase brushless direct current (DC) motor 12. DC motor 12 includes a known rotor (not shown), a plurality of windings (inductance coils) for electromagnetically rotating the rotor, and three rotor position detectors 14a, 14b, 14c that are arranged at specific positions corresponding to the coils respectively.

As shown in FIG. 1, the power converter 10 includes a main DC power supply unit 16, which is adapted to be connected to a commercial alternate voltage source (not shown) and which produces a DC power supply voltage at a preselected potential level. Power converter 10 also includes an output stage section 18, which is electrically fed by DC power supply 16 to drive and control the DC motor 12. Output section 18 is a bridge circuit that includes three pairs of output power devices Q1 to Q6, which are coupled to the winding coils of motor 12 at their common intermediate nodes respectively. Power devices Q are charge-transfer actuable devices each having a control electrode and first and second current carrying electrodes. These devices may be insulated gate bipolar transistors (IGBTs). Note that the first and second current carrying electrodes of each IGBT is called the "source and drain" electrodes.

The IGBT pairs are connected in parallel with one another between circuit nodes N1 and N2, which are connected to a power supply voltage line 20 and a ground potential line 22 respectively. A resistive element R for current detection is arranged between node N2 and ground line 22. Of the IGBTs, specific IGBTs Q1, Q3, Q5 having drain electrodes coupled to power supply line 20 are called the "upper-stage transistors"; the remaining three IGBTs which have source electrodes connected to ground line 22, are called the "lower-stage transistors." These EGBTs Q1 to Q6 are provided with diodes D1 to D6 respectively. Each diode Di (i=1, 2, ..., 6) is connected to the source and drain of a corresponding IGBT Qi as shown in FIG. 1 to define a current-forward direction.

Driver circuits 24-1 to 24-6 are connected to the gate electrodes of six IGBTs Q1 to Q6 respectively. These drivers 24 control the switching operations of IGBTs Q in a variety of modes. Those 24-1, 24-3, 24-5 of the drivers associated with the upper-stage transistors Q1, Q3, Q5 will be called the "upper-stage driver," and the remaining drivers 24-2, 24-4, 24-6 connected to the lower-stage transistors Q2, Q4, Q6 are called the "lower-stage drivers" hereinafter. Note that upperstage drivers 24-1, 24-3, 24-5 are connected with diodes D7, D8, D9 and capacitors C1, C2, C3. Diodes D7-D9 have inputs coupled to a second DC power supply voltage line 26, and outputs coupled to drivers 24-1, 24-3, 24-5, respectively. Second DC power supply line 26 is supplied by a DC power supply unit 28 with a constant voltage Vcc of a predetermined potential. Unit 28 will be called the "inverter power supply" in the rest of the description. Lower-stage drivers 24-2, 24-4, 24-6 have no diode/capacitor circuits, and are directly connected to second power supply line 26.

A control circuit 30 is connected between the second power supply line 26 and the ground line 22. Controller 30 may be a microprocessing unit, which is integrated and packed in a one-chip IC together with the components for the inverter circuitry. Controller 30 has inputs for receiving electrical detection signals Sd1, Sd2, Sd3, which are generated by the rotor position detectors 14a, 14b, 14c of three-phase DC motor 12. Controller 30 is connected at another input to a speed signal generating circuit 32. This circuit has an input terminal 34, to which a speed control signal Sc is supplied externally. In response to speed control signal Sc, circuit 32 supplies controller 30 with a constant pulse-width signal Sp, which has been pulse-width modulated to represent a desired motor speed. Typically, the pulse frequency of signal Sp ranges from several kilohertz to several tens kilohertz. Circuit 32 will be referred to as a "PWM generator." PWM generator 32 is connected to second power supply line 26.

The controller 30 is connected at the other inputs thereof to three types of protection circuits, which are an overvoltage protection circuit 36, an overheat protection circuit 38 and an overcurrent protection circuit 40. Overvoltage protector 36 has an input connected to a voltage detecting circuit 42, which detects the actual potential on the first (main) power supply line 20. Overheat protector 38 has an input terminal 44 for receiving a heat monitor signal Sh indicative of a measured heat of the output transistors Q1 to Q6. When output transistors Q rush into the overheat condition, protector 38 supplies controller 30 with a corresponding signal indicative of such condition. Overcurrent protector 40 is connected at its input to the common source node N2 of lower-stage transistors Q2, Q4, Q6 and resistive element R. Resistive element R generates a current detection signal Si, which is supplied to overcurrent protector 40.

The controller 30 has outputs connected to the inputs of upper-stage drivers 24-1, 24-3, 24-5 through three level-shift circuits 46. Controller 30 is directly connected at the other outputs thereof to lower-stage drivers 24-2, 24-4, 24-6. Drivers 24-1 to 24-6 supply switching control signals Ss1 to Ss6 to IGBTs Q1 to Q6, respectively, under the control of controller 30.

Figure 2:
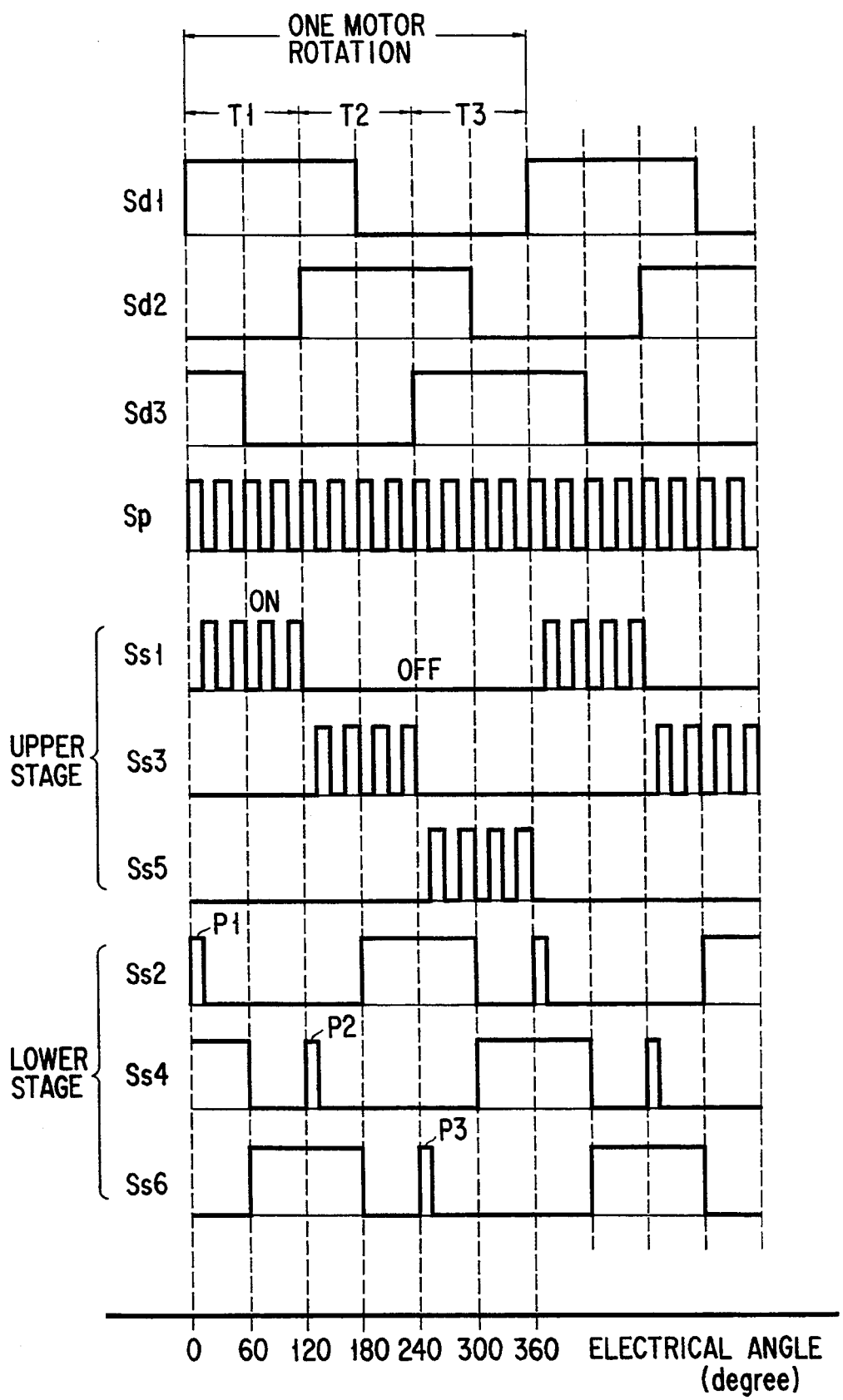
FIG. 2 is an illustration of timing diagram showing the pulsing sequences for the operation of the embodiment shown in FIG. 1.

The operation of the three-phase inverter power converting device 10 will be described with reference to the pulsing sequence illustrated in the timing waveform of FIG. 2, wherein one rotation of the three-phase DC motor 12 is represented in the scale of electrical angle period which ranges zero to 360 degrees. The main functions of controller 30 are as follows. Controller 30 controls the upper-stage drivers 24-1, 24-3, 24-5 coupled to IGBTs Q1, Q3, Q5 so that these IGBTs perform different switching operations in synchronism with the same PWM pulse signal Sp during three electrical angle periods T1, T2, T3, which are shifted by 120 degrees respectively as shown in FIG. 2. During the first half of a certain 120-degree electrical angle period for the PWM turn-on/off drive of an upper-stage IGBT in a certain transistor pair, the lower-stage transistor (Q4) of one of the other transistor pairs turns on in response to a turn-on voltage of a constant potential, which is supplied by a corresponding driver associated therewith. During the following second half of the certain 120-degree period, the lower-stage transistor (Q6) of the remaining transistor pair turns on constantly.

More specifically, when the rotor-position detection signals Sd1, Sd2, Sd3 are supplied to controller 30 from the rotor position detectors 14 of motor 12, controller 30 then activates one upper-stage driver which is coupled to the upper-stage transistor of a specific pair corresponding to one rotor position being presently detected. Activating the driver allows the specific upper-stage transistor to be PWM-driven to repeat a number of turn-on and off switching operations, thus causing a current to flow through a corresponding one of winding coils of motor 12. Increase or decrease of the rotating speed of motor 12 may be attained by changing or modifying the pulse width of the pulse signal Sp generated by PWM generator 32 shown in FIG. 1 to thereby control the average value of the integration of a pulsate current flowing through the motor winding coil.

For purposes of explanation, assume that current is supplied to a winding coil coupled to the first pair of IGBTs Q1, Q2. The waveforms of rotor-position detection signals Sd1 to Sd3 obtained from motor 12 in this case are shown in the top of the illustration of FIG. 2, together with the waveform of the output pulse signal Sp of PWM generator 32.

As shown in FIG. 2, during the first 120-degree electrical angle period T1, the first upper-stage IGBT Q1 is supplied by driver 24-1 with the pulse switching drive signal Ss1 in synchronism with PWM pulse signal Sp at the gate electrode thereof under the control of controller 30. This IGBT repeats a number of turn-on/off switching operations. Under such a condition, during the first half (60-degree period) of period T1, a DC voltage signal Ss4 of high potential is applied by driver 24-4 to the gate electrode of the second lower-stage IGBT Q4, causing IGBT Q4 to turn on continuously. Current thus flows into a corresponding winding coil of motor 12 by way of IGBTs Q1, Q4, forcing the rotor to rotate at certain speed corresponding to the pulse width modulation factor. When the modulation factor of signal Ss1 increases, the average value of current flow at the winding increases, causing the rotation speed to increase. If the modulation factor decreases, the average current reduces to cause the rotor rotation speed to decrease.

During the second half (the following 60-degree electrical angle period) of the period T1, the signal Ss4 drops at the low potential level, causing the second lower-stage IGBT Q4 to turn off. Alternatively, a high-level DC voltage signal Ss6 is given by driver 24-6 to the gate electrode of the third lower-stage IGBT Q6, causing IGBT Q6 to turn on. Current begins to flow into the same motor winding through IGBTs Q1 and Q6, forcing the rotor to further rotate at the speed corresponding to the pulse width modulation factor of signal Ss1.

Very importantly, while the upper-stage IGBT Q1 is PWM-switching-driven during the period T1, a corresponding lower-stage transistor (i.e., IGBT Q2) is so controlled as to turn on for a shortened period at the beginning of period T1 (0-degree time point), and then to turn off constantly until a specific time of the 180-degree electrical angle. To do this, a special drive signal Ss2 having a reverse-phased pulse component P1 is applied to the gate electrode of IGBT Q2. As apparent from FIG. 2, the pulse waveform P1 of drive signal Ss2 is synchronous with the PWM pulse signal Sp and is reverse in pulse phase to the switching drive pulse signal Ss1. In other words, when IGBT Q2 turns off for the above shortened period, IGBT Q1 is forced to turn off. It will never occur that the two IGBTs Q1, Q2, which constitutes one transistor pair, turn on simultaneously. Even during the shortened period during which the lower-stage IGBT Q2 turns on, current can flow from the inverter power supply 28 through diode D7 and IGBT Q2 to capacitor C1 coupled with driver 24-1, thus additionally charging this capacitor C1.

Such additional charging can compensate for the natural discharge at capacitor C1 almost completely to ensure that a desired voltage is held at the terminal electrode of capacitor C1. The holding of such voltage at the capacitor terminal enables the upper-stage IGBT Q1 to be supplied with an enough drive voltage. IGBT Q1 thus turns on in response to the PWM drive signal Ss1 causing a current to flow in a corresponding winding coil of motor 12. Then, IGBT Q1 turns off. While this IGBT turns off, the winding current continues to flow through the diode D2 arranged at the lower stage of IGBT pair Q1, Q2 due to the regeneration of energy stored in the winding coil. At this time, the cathode voltage of diode D2 is substantially at the ground potential, thereby charging capacitor C1 again.

This means that, even during the period T1 for PWM switching drive of the upper-stage IGBT Q1, the corresponding driver capacitor C1 can be charged so that driver 24-1 is supplied with necessary power by the charged capacitor C1. This can allow capacitor C1 to have a decreased charge storage capacity that is less than the conventionally required one, so that capacitor C1 can be miniaturized accordingly. The same goes with the remaining capacitors C2, C3 that are coupled to the other upper-stage drivers 24-3, 24-5. These capacitors C2, C3 can be additionally charged by supplying similar pulses P2, P3 to the corresponding lower-stage IGBTs Q6 during the PWM switching drive periods T2, T3 for the upper-stage IGBTs Q3, 05, respectively.

Figure 3:
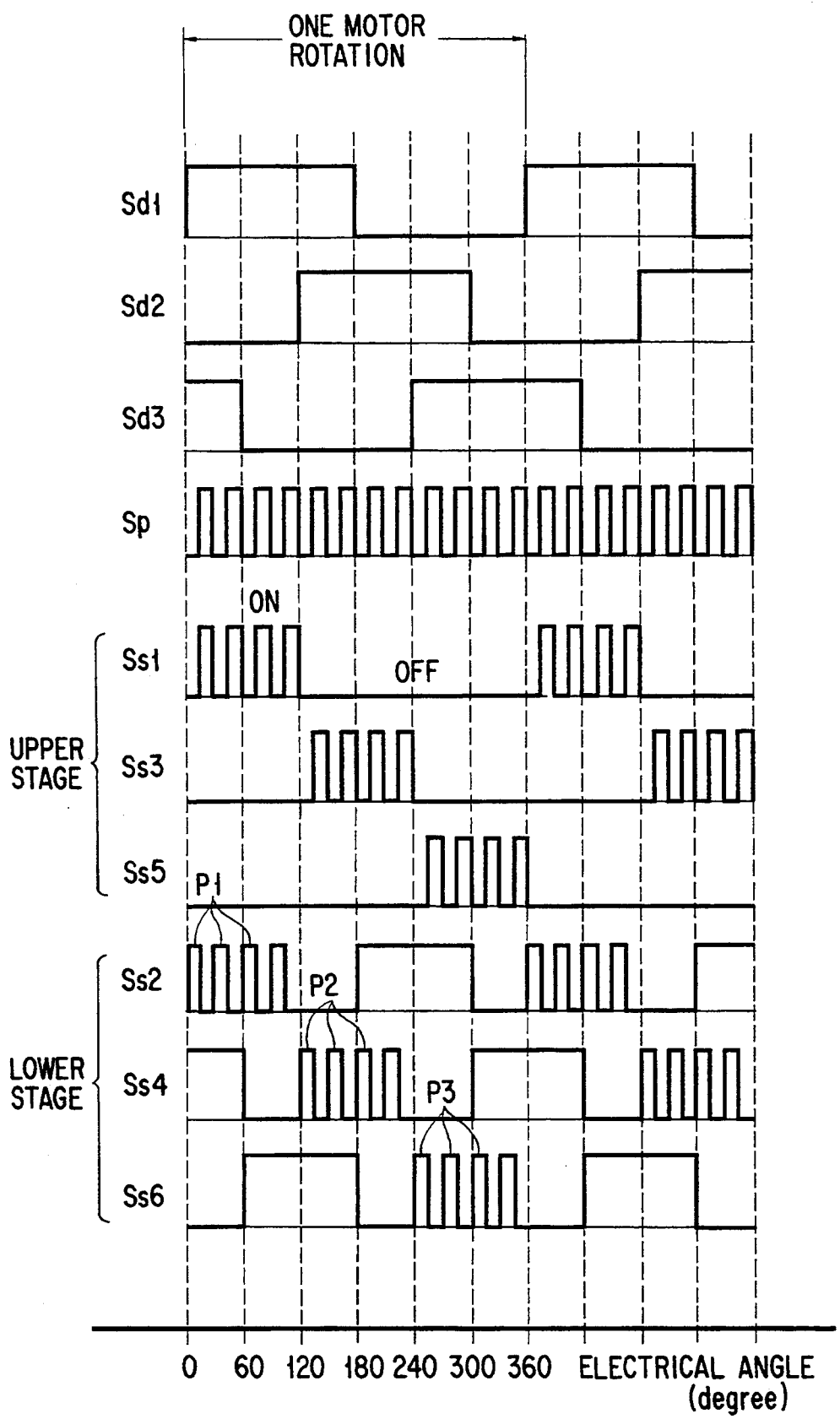
FIG. 3 is an illustration of timing diagram showing the modified pulse sequences of the embodiment of FIG. 1.

The additional charge-control pulses P1, P2, P3 supplied to the lower-state IGPTs Q2, 04, Q6 may be modified in their pulse waveform as shown in FIG. 3, wherein each lower-stage IGBT Q2, Q4 or Q6 is arranged to receive a pulse-train signal having a plurality of reverse-phased pulse components P1, P2 or P3, which signal is obtained by phase-inverting PWM switching drive signal Ss1, Ss3 or Ss5 supplied to a corresponding upper-stage IGBT Q1, Q3 or Q5. This enables capacitor Ci (i=1, 2, 3) to be repeatedly charged for a number of shortened turn-on periods throughout the whole region of the PWM switching drive period T1, T2, T3 for each upper-stage IGBT Q1, Q3, Q5.

With such an arrangement, the following technical advantage can be obtained in addition to the previously described advantages of the embodiment shown in FIG. 2. A significant inverter drive can also be accomplished even in a case wherein the load to be controlled is a resistive load other than the inductive load such as the DC motor 12 of FIG. 1. The reason for this will be explained with respect to one upper-stage IGBT transistor Q1 for the explanation purposes only. The same goes with the remaining ones.

When the resistive load (non-inductive load) is employed, since such lead does not have any capability of energy storage therein, the aforementioned regenerative current flow will not occur. Therefore, when IGBT Q1 turns off, diode D2 will not turn on so that the cathode voltage of diode D2 is kept at a certain intermediate potential between the potentials at nodes N1, N2. The flow of current through capacitor C1 will disappear rapidly. Capacitor C1 cannot be charged any more. This shows the fact that the charging efficiency of capacitor C1 in the case of resistive load is less than that in the case of inductive load. By supplying the charge-controlling pulse trains P1 throughout the whole turn-on/off drive period T1 of upper-stage IGBT Q1, the chances of charging capacitor C1 can increase, thus improving the power feed for driver 24-1 more successfully.

The present invention is not limited to the above-described specific embodiments and may be practiced or embodied in still other ways without departing from the spirit or essential character thereof.

What is claimed is:

1. An electric power conversion device for supplying a load with a continuously variable current, said device comprising:

an output section of bridge circuitry adapted to be coupled to the load, said output section including a series circuit of a first switch device and a second switch device;

first drive means connected to said first switch device, for electrically driving the same, said first drive means having a charge storage device coupled to said first drive means to be charged when said second switch device turns on;

second drive means connected to said second switch device for electrically driving said second switch device; and control means connected to the first and second drive means, for (i) causing, during a designated period, said first drive means to supply said first switch device with a pulse signal which is modulated in its pulse width at a desired index of pulse width modulation to drive said first switch device in a pulse width modulation to drive said first switch device in a pulse width modulation control manner, thereby to provide said load with a suitable current corresponding to the index of pulse width modulation, for (ii) providing said second switch device with at least one pulse which is reverse in phase to said pulse signa to force said second switch device to turn on during the period, thereby charging said charge storage device and (iii) for further charging said charge storage device during a period a non-conductivity of said respective first and second switch device.

2. The device according to claim 1, wherein said control means comprises:

signal generation means for receiving an electrical signal indicative of a desired amount of current to be supplied to said load, and for generating a pulse width modulated signal having a series of pulses which are changed in pulse width accordingly.

3. The device according to claim 2, wherein said first and second switch devices comprise charge-transfer actuable devices including transistors, and current-rectifying devices including diodes.

4. The device according to claim 3, wherein said transistors include insulated gate bipolar transistors.

5. The device according to claim 2, wherein said control means comprises a microprocessor responsive to said signal generation means.

6. The device according to claim 5, wherein said microprocessor causes said pulse signal to be synchronous with said pulse width modulated signal.

7. The device according to claim 6, wherein said load includes a direct current motor.

8. An inverter circuit for controlling a motor in variable speed, said circuit comprising: a plurality of pairs of output transistors connected to said motor and each having first and second current carrying electrodes and a control electrode, said pairs of output transistors being connected in parallel with one another between a power supply voltage and a ground potential and coupled to said motor at intermediate nodes thereof thereby providing upper-stage transistors having first current carrying electrodes connected to said power supply voltage, and lower-stage transistors having second current carrying electrodes connected to said ground potential;

diodes coupled to said output transistors;

first drivers connected to the control electrodes of said upper-stage transistors, each of said drivers having a capacitive element having an electrode coupled to said power supply voltage and another electrode coupled to said ground potential through one lower-stage transistor series-connected to a corresponding upperstage transistor associated therewith;

second drivers connected to the control electrodes of said lower-stage transistors;

signal generator means for providing a pulse width modulation or PWM signal having a series of pulses which are modified in pulse width to represent a desired rotation speed of said motor; and controller means connected to said first drivers, said second drivers and said signal generator means, for (i) causing, during a selected period, a selected one of said first drivers which is associated with a selected upper-stage transistor to supply said selected upper-stage transistor with a pulse drive signal in synchronism with said pulse width modulation signal so that said selected upper-stage transistor repeats turn on and off operations, (ii) for, during a different period, causing a selected one of said second drivers which is connected to a certain lower-stage transistor which forms a pair with said selected upper-stage transistor to supply said certain lower-stage transistor with a constant turn-on voltage, thereby charging a specific capacitive element coupled to said selected one of said first drivers, and (iii) for providing, during said selected period, said certain lower-stage transistor with a turn-on pulse signal having one or a plurality of pulse components which are reverse in phase to said pulse drive signal, thereby to further charge said specific capacitive element.

9. The circuit according to claim 8, wherein said upper-stage transistors and said lower-stage transistors include insulated gate bipolar transistors.

10. The circuit according to claim 9, wherein said controller means includes a microprocessor which is integrated on a chip substrate together with said first drivers, said second drivers and said insulated gate bipolar transistors.

11. The circuit according to claim 10, further comprising:

a level shift circuit arranged between each of said first drivers and said microprocessor.

12. The circuit according to claim 11, further comprising:

a resistive element for current detection connected between the second current carrying electrodes of said lower-stage transistors and said ground potential, said microprocessor being responsive to said resistive element.

13. The circuit according to claim 12, wherein said signal generator means has an input terminal for externally receiving a signal indicative of a desired rotation speed of said motor.

14. The circuit according to claim 13, wherein said motor includes a multiple-phase brushless direct current motor.

* * * * *